(12) United States Patent
Matsumoto

(10) Patent No.: US 8,120,128 B2
(45) Date of Patent: Feb. 21, 2012

(54) OPTICAL DEVICE

(75) Inventor: Katsuyoshi Matsumoto, Osaka (JP)

(73) Assignee: Panasonic Corporation, Osaka (JP)

( * ) Notice: Subject to any disclaimer, the term of this patent is extended or adjusted under 35 U.S.C. 154(b) by 150 days.

(21) Appl. No.: 12/194,193

(22) Filed: Aug. 19, 2008

(65) Prior Publication Data

US 2009/0096048 A1    Apr. 16, 2009

(30) Foreign Application Priority Data

Oct. 12, 2007  (JP) ................. 2007-266447
May 23, 2008  (JP) ................. 2008-135535

(51) Int. Cl.
*H01L 31/0232*  (2006.01)
(52) U.S. Cl. ................. 257/432; 257/E31.127
(58) Field of Classification Search .......... 257/432–466, 257/E31.127
See application file for complete search history.

(56) References Cited

U.S. PATENT DOCUMENTS

| 6,870,208 | B1 | 3/2005 | You et al. |
| 7,154,156 | B2 * | 12/2006 | Minamio et al. ............ 257/431 |
| 2003/0209787 | A1 | 11/2003 | Kondo et al. |
| 2005/0116142 | A1 | 6/2005 | Mok et al. |

FOREIGN PATENT DOCUMENTS

WO    WO 97/05660    2/1997

* cited by examiner

*Primary Examiner* — Tucker Wright
(74) *Attorney, Agent, or Firm* — McDermott Will & Emery LLP

(57) ABSTRACT

An optical device includes a base and an optical element. The base has a through hole in a center and includes leads and a resin. Each lead has an L-shaped cross-section and is formed by an inner lead extending from the center toward a peripheral edge and an outer lead connected to the inner lead and extending downward. The optical element is provided under the base so as to correspond to the through hole. Electrode pads of the optical element are connected to the leads of the base through bumps, respectively. The resin is formed so as to cover respective inner ends of the leads and respective front surfaces of the inner leads and to fill a gap between adjacent leads, and respective outer ends of the leads and respective front surfaces of the outer leads are exposed.

12 Claims, 9 Drawing Sheets

OPTICAL DEVICE

CROSS REFERENCE TO RELATED APPLICATIONS

This application claims priority under 35 U.S.C. §119 on Patent Application No. 2007-266447 filed in Japan on Oct. 12, 2007 and Patent Application No. 2008-135535 filed in Japan on May 23, 2008, the entire contents of which are hereby incorporated by reference.

BACKGROUND OF THE INVENTION

1. Field of the Invention

The invention relates to an optical device on which an optical element for emitting or receiving light is mounted and a manufacturing method thereof, and a camera module having the optical device mounted thereon.

2. Related Art

With recent improvement in capability of semiconductor devices, the amount of heat that is generated in the semiconductor devices has been increasing, and improvement in heat release efficiency of the semiconductor devices has been greatly demanded. Especially optical devices need to have an optical path above an optical element, and a heat releasing member cannot be provided above the optical element. Therefore, the structure of the optical devices is more disadvantageous in terms of heat release efficiency as compared to other semiconductor devices.

For example, in most image sensor devices, a light receiving element is provided in the center of a silicon chip, a control circuit is provided in the periphery of the chip, and electrode pads are provided on the control circuit, or on and outside the control circuit. In most cases, the chip is mounted on a base made of a ceramic material, resin or the like and having a recessed cross-section by using a paste material, a tape, or the like so that the element formation surface of the chip faces the front. The electrode pads on the chip are connected to electrodes provided within the base through thin gold wires or the like, and the recess of the base is closed by a transparent member such as glass. The recess of the base is generally closed so that the transparent member does not contact the chip surface.

Such an image sensor device mainly releases heat through the following path: heat generated in the control circuit is conducted to the back surface of the chip through the inside of the chip, to the base through the paste material, tape or the like, and to the outside of the image sensor device through the base. The heat thus conducted to the outside of the image sensor device is released through a portion on which the image sensor device is mounted or a heat sink provided in the image sensor device.

With recent increase in the heat generation amount in the control circuit, however, there has been a recognized concern that the above heat release path is not enough to release the heat generated in the control circuit, and high temperature in the control circuit region may cause malfunction or breakdown of the control circuit.

One measure against this is to connect the electrode pads located close to the control circuit to the electrodes within the base by using bumps instead of the thin gold wires. A heat release path can thus be ensured by the bumps, leads and the like having high thermal conductivity efficiency. One example of this type of optical device is shown in FIG. 12. FIG. 12 is a cross-sectional view showing a structure of a conventional optical device.

The optical device of FIG. 12 mainly includes a base 203 and an optical element (image sensor chip) 204. The base 203 has leads 201 sealed in a resin 202 and has a through hole 207 in the center. Each lead 201 has an external terminal 201t at its outer end (each lead 201 is formed by an inner lead and an outer lead). The optical element 204 has a light detecting region 205 in the center. Electrode pads on the optical element 204 are respectively connected to the inner leads of the base 203 through bumps 206. As shown in FIG. 12, each inner lead extends from the center toward a peripheral edge, and is sealed in the resin 202 so that the back surface of the inner lead is exposed in a contact region with the bump 206. As shown in FIG. 12, each outer lead is connected to the respective inner lead and protrudes downward, and no resin is formed on the outer leads. A control circuit (not shown) and the electrode pads are provided outside the light detecting region 205 of the optical element 204. A light shielding film 208 is formed in the periphery of the optical element 204. The light shielding film 208 prevents unnecessary light beams from entering from the back surface of the optical element 204 and prevents dust and the like from entering and adhering to the surface of the optical element 204. In this structure, local heat that is generated in the control circuit on the optical element 204 is conducted from the electrode pads located close to the control circuit to the leads 201 through the bumps 206. An efficient heat release path is thus ensured for this local heat (for example, see Patent document 1: WO1997/005660).

However, the conventional optical device has the following problem:

As shown in FIG. 12, in the conventional optical device, most of the back surface of the optical element 204 is in contact with air, and almost no region of the optical element 204 is in contact with another member. Therefore, the overall heat generated in the optical element is hardly released through a contact region with another member. In other words, a sufficient heat release path cannot be ensured for the overall heat generation in the optical element, causing degradation in the overall heat release efficiency of the optical element.

The same problem also occurs in a hollow-type semiconductor device having a semiconductor element mounted thereon and having the same structure as that of the above optical device. In the hollow-type semiconductor device, most of the back surface of the semiconductor element is in contact with air, and almost no region of the semiconductor element is in contact with another member. Therefore, the overall heat generated in the semiconductor element is hardly released through a contact region with another member. In other words, a sufficient heat release path cannot be ensured for the overall heat generation in the semiconductor element, causing degradation in the overall heat release efficiency of the semiconductor element.

SUMMARY OF THE INVENTION

In view of the above problems, it is a first object of the invention to improve not only heat release efficiency of a control circuit on an optical element but the overall heat release efficiency of the optical element in an optical device. It is a second object of the invention to improve the overall heat release efficiency of a semiconductor element in a semiconductor device.

In order to achieve the first object, an optical device according to one aspect of the invention is characterized in that the optical device includes: a base having a through hole in a center and including leads and a resin, each lead having an L-shaped cross-section and being formed by an inner lead extending from the center toward a peripheral edge and an outer lead connected to the inner lead and extending downward; and an optical element provided under the base so as to correspond to the through hole, wherein electrode pads of the optical element are connected to the leads of the base through bumps, respectively, and the resin is formed so as to cover respective inner ends of the leads and respective front surfaces of the inner leads and to fill a gap between adjacent leads, and respective outer ends of the leads and respective front surfaces of the outer leads are exposed. Preferably, the optical device further includes a thin plate body provided over a back surface of the optical element.

According to the optical device of the one aspect of the invention, a heat release path from the optical element to the thin plate body can be ensured by providing the thin plate body over the back surface of the optical element. As a result, the overall heat release efficiency of the optical element can be improved by using a contact region with another member, that is, the thin plate body.

In a conventional example, no resin is formed on outer leads and the whole surface of the outer leads is exposed. In the optical device of the invention, on the other hand, the resin is formed so as to fill the gap between adjacent outer leads, and respective outer ends, front surfaces, and back surfaces of the outer leads are exposed. In this way, an optical device compatible with an existing surface-mounting type optical device having terminals only in a peripheral portion can be implemented. Therefore, the optical device of the invention can be replaced with, for example, an optical device that is used in an existing camera module.

An efficient heat release path is formed from the optical element to external terminals through a metal having high thermal conductivity efficiency. Especially, since the bumps are provided between the leads and the electrode pads, the thermal conductivity efficiency can be improved as compared to a conventional example in which thin long gold wires are provided. Moreover, the respective front surfaces of the inner leads are covered with the resin. Therefore, even when a camera module is formed by using the optical device of the invention, unnecessary reflection at the front surfaces of the inner leads can be prevented and only necessary light beams can reach the light detecting region.

In the optical device of the one aspect of the invention, it is preferable that the thin plate body is made of a material having high thermal conductivity efficiency.

In the optical device of the one aspect of the invention, it is preferable that a bonding member is provided between the optical element and the thin plate body.

In the optical device of the one aspect of the invention, it is preferable that the optical device further includes a transparent member provided in the through hole of the base and that the optical element provided under the base is hermetically sealed by the transparent member and the thin plate body.

With this structure, the base is hermetically sealed by the transparent member provided in the through hole of the base and the thin plate body provided under the base with the optical element interposed therebetween. Therefore, dust, water and the like can be prevented from entering from the outside, and a defective optical device can be prevented from being caused by adhesion of dust, water, and the like.

In the optical device of the one aspect of the invention, it is preferable that an adhesive is provided between the transparent member and the base.

In the optical device of the one aspect of the invention, it is preferable that the optical device further includes electrodes provided on a back surface of the thin plate body so as to correspond to external terminals located at the outer ends of the leads, respectively.

With this structure, not only electric connection with the external terminals but electric connection with the electrodes can be ensured when the optical device of the invention is introduced into a camera module. Therefore, the optical device of the invention can be reliably introduced into the camera module.

In the optical device of the one aspect of the invention, it is preferable that a stepped portion having a shape corresponding to a corner shape of the thin plate body is provided in an outer end region of the base, and that the thin plate body is mounted in the stepped portion so that the base and the thin plate body fit together.

With this structure, the thin plate body can be easily positioned when the thin plate body is attached to the optical element. As a result, attachment accuracy can be improved and an attachment method can be simplified.

In the optical device of the one aspect of the invention, it is preferable that a part of the resin which is formed on the inner ends of the leads has a tapered shape so that an inner diameter of the through hole increases from an upper end toward a lower end.

With this structure, incident light entering the through hole of the base is not reflected from the inner surface of the through hole. Therefore, noise light can be prevented from being generated from the incident light reflected from the inner surface of the through hole to the light detecting region of the optical element.

In order to achieve the first object, a method for manufacturing an optical device according to one aspect of the invention is characterized in that the method includes the steps of: (a) preparing a base having a through hole in a center and including leads and a resin, each lead having an L-shaped cross-section and being formed by an inner lead extending from the center toward a peripheral edge and an outer lead connected to the inner lead and extending downward; (b) forming bumps on electrode pads formed on a surface of an optical element having a light detecting region in a center; (c) after the steps (a) and (b), providing the optical element under the base so as to correspond to the through hole, and connecting the leads of the base with the electrode pads of the optical element through the bumps, respectively; (d) providing a thin plate body on a back surface of the optical element through a bonding member; and (e) providing a transparent member in the through hole of the base through an adhesive, wherein the step (a) is a step of preparing the base having the resin formed so as to cover respective inner ends of the leads and respective front surfaces of the inner leads and to fill a gap between adjacent leads.

In the method for manufacturing an optical device according to the one aspect of the invention, the thin plate body is provided on the back surface of the optical element. Therefore, a heat release path from the optical element to the thin plate body can be ensured, whereby the overall heat release efficiency of the optical element can be improved.

Moreover, the base is hermetically sealed by the transparent member provided in the through hole of the base and the thin plate body provided under the base with the optical element interposed therebetween. Therefore, dust, water, and the like can be prevented from entering from the outside, and a defective optical device can be prevented from being caused by adhesion of dust, water, and the like.

Moreover, an optical device compatible with an existing surface-mounting type optical device can be implemented.

Therefore, the optical device of the invention can be replaced with, for example, an optical device that is used in an existing camera module.

Moreover, the optical device can be manufactured by using only versatile bump bonding and adhesion technologies. Therefore, the optical device can be easily manufactured at low cost. In other words, the optical device can be manufactured without involving complicated formation such as formation of a light shielding film as in a conventional example.

In the method for manufacturing an optical device according to the one aspect of the invention, it is preferable that the step (a) includes the steps of (a1) preparing lead frames having a predetermined length and corresponding to a number of leads included in the base, (a2) bending the lead frames at positions corresponding to junctions between the inner leads and the outer leads and at positions corresponding to outer ends of the leads, respectively, (a3) after the step (a2), putting a lower mold having the lead frames placed thereon and an upper mold together to form a cavity between the lower mold and the upper mold, (a4) after the step (a3), filling the cavity with a resin and curing the resin to form a molded body comprised of the lead frames and the resin, and opening the lower mold and the upper mold to remove the molded body, and (a5) after the step (a4), cutting the molded body at positions corresponding to the outer ends of the leads to obtain individual bases, wherein the molded body having the resin formed so as to cover a surface to be the respective inner ends of the leads and a surface to be the respective front surfaces of the inner leads and to fill the gap between adjacent lead frames is formed in the step (a4).

In this method, the base can be manufactured by using only versatile lead processing technology and versatile resin molding technology. Therefore, the base can be easily manufactured at low cost.

In order to achieve the second object, a semiconductor device according to one aspect of the invention is characterized in that the semiconductor device includes: a base including leads and a resin, each lead having an L-shaped cross-section and being formed by an inner lead extending from a center toward a peripheral edge and an outer lead connected to the inner lead and extending downward; and a semiconductor element having electrode pads provided under the base so as to correspond to the leads, respectively, wherein the electrode pads of the semiconductor element are connected to the leads of the base through bumps, respectively, and the resin is formed so as to cover respective inner ends of the leads and respective front surfaces of the inner leads and to fill a gap between adjacent leads, and respective outer ends of the leads and respective front surfaces of the outer leads are exposed. Preferably, the semiconductor device further includes a thin plate body provided over a back surface of the semiconductor element.

In the semiconductor device according to the one aspect of the invention, a heat release path from the semiconductor element to the thin plate body can be ensured by providing the thin plate body over the back surface of the semiconductor element. As a result, the overall heat release efficiency of the semiconductor element can be improved by using a contact region with another member, that is, the thin plate body.

Moreover, the base is hermetically sealed by the thin plate body provided under the base with the semiconductor element interposed therebetween. Therefore, dust, water and the like can be prevented from entering from the outside, and a defective semiconductor device can be prevented from being caused by adhesion of dust, water, and the like.

Moreover, an efficient heat release path is formed from the semiconductor element to the external terminals through a metal having high thermal conductivity efficiency. Especially, since the bumps are provided between the leads and the electrode pads, the thermal conductivity efficiency can be improved as compared to a conventional example in which thin long gold wires are provided.

As described above, in the optical device and the manufacturing method according to the invention, a heat release path from the optical element to the thin plate body can be ensured by providing the thin plate body over the back surface of the optical element. As a result, the overall heat release efficiency of the optical element can be improved by using a contact region with another member, that is, the thin plate body. Moreover, an optical device compatible with an existing surface-mounting type optical device can be implemented.

In the semiconductor device according to the invention, a heat release path from the semiconductor element to the thin plate body can be ensured by providing the thin plate body over the back surface of the semiconductor element. As a result, the overall heat release efficiency of the semiconductor element can be improved by using a contact region with another member, that is, the thin plate body.

DETAILED DESCRIPTION OF THE PREFERRED EMBODIMENTS

Figure 1A:
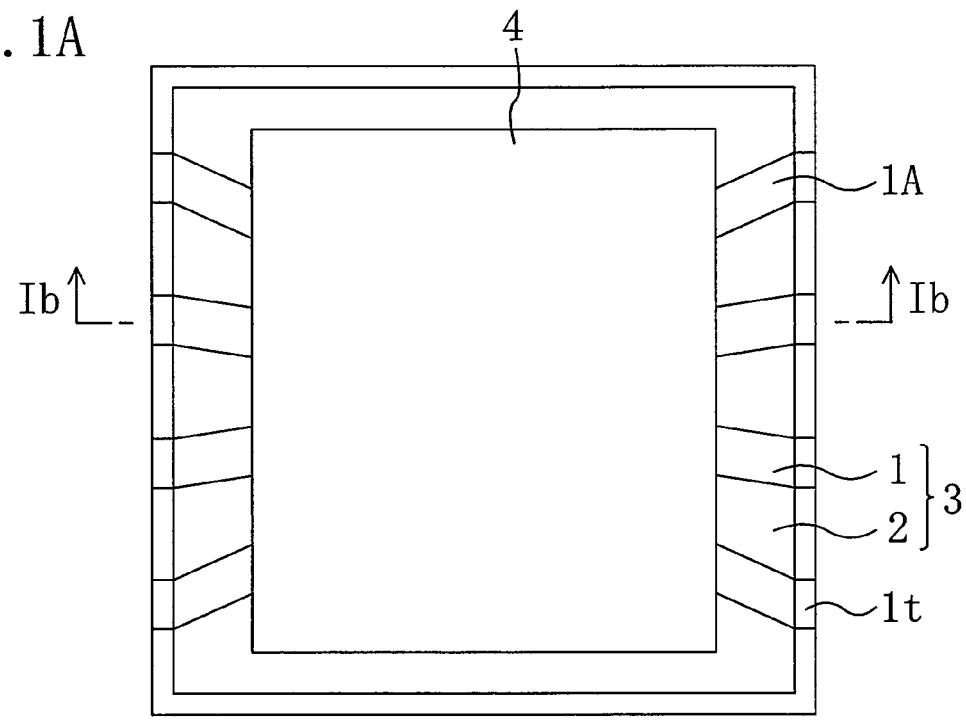
FIGS. 1A, 1B, and 1C are diagrams showing a structure of an optical device according to a first embodiment of the invention.

Hereinafter, embodiments of the invention will be described with reference to the accompanying drawings. Note that, for convenience, the thickness, length, and the like of each element shown in the figures are not drawn to actual scale. The same components are denoted by the same reference numerals and characters throughout the figures, and description may be omitted.

First Embodiment

Figure 1B:
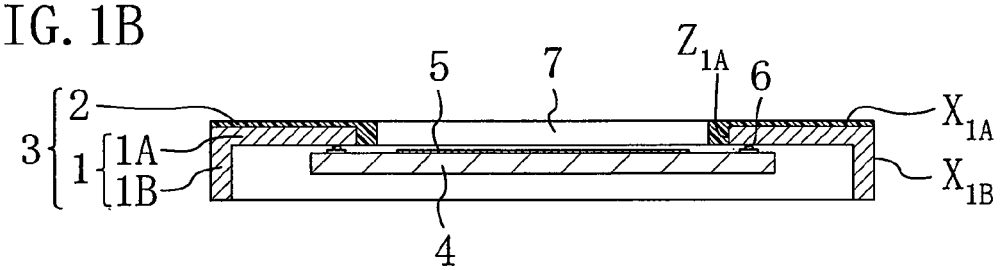
Figure 1C:
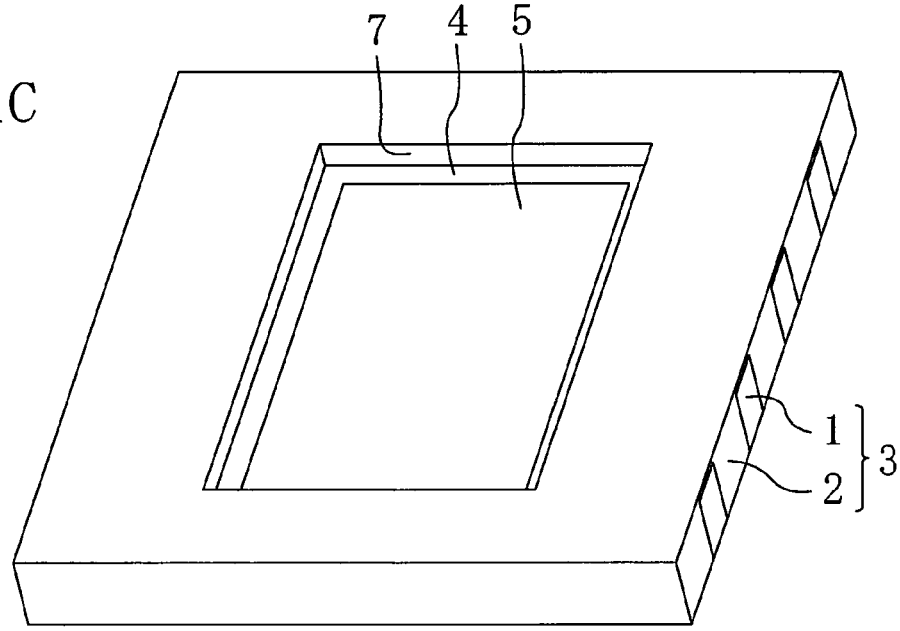

Hereinafter, an optical device according to a first embodiment of the invention will be described with reference to FIGS. 1A through 1C. FIGS. 1A through 1C are diagrams showing a structure of the optical device of the first embodiment. FIG. 1A is a plan view of the optical device when viewed from the back side of an optical element. FIG. 1B is a cross-sectional view taken along line Ib-Ib in FIG. 1A. FIG. 1C is a perspective view of the optical device when viewed from the front side of the optical element.

As shown in FIG. 1B, the optical device of this embodiment mainly includes a base 3 and an optical element 4. The base 3 has a through hole 7 in the center and includes leads 1 and a resin 2. The optical element 4 is provided under the base 3 so as to correspond to the through hole 7, and has a light detecting region 5 in the center. The leads 1 of the base 3 are respectively connected to electrode pads on the optical element 4 through bumps 6.

As shown in FIG. 1B, each lead 1 is formed by an inner lead 1A and an outer lead 1B. The inner lead 1A extends from the center toward a peripheral edge, and the outer lead 1B is connected to the inner lead 1A and extends downward. The leads 1 have an L-shaped cross section. Each lead 1 has an external terminal it at its outer end (see especially FIG. 1A).

The base 3 is formed by a plurality of leads 1 included in a single optical device, and a resin 2 for integrating the plurality of leads 1. As shown in FIG. 1B, the base 3 has a through hole 7 in the center. The through hole 7 is smaller in shape than the optical element 4.

The optical element 4 has a control circuit (not shown) and electrode pads. As shown in FIG. 1B, the control circuit and the electrode pads are provided outside the light detecting region 5. The optical device of this embodiment includes an optical device having only a light receiving element mounted thereon as the optical element 4, an optical device having only a light emitting element mounted thereon as the optical element 4, or an optical device having both a light receiving element and a light emitting element mounted thereon as the optical element 4. An example of the light receiving element is an image sensor such as a CMOS (Complementary Metal Oxide Semiconductor) sensor and a CCD (Charge Coupled Device) sensor. Examples of the light emitting element are a laser, a light emitting diode, and the like. In the case of an optical device having only a light receiving element mounted thereon as the optical element 4, the light detecting region 5 indicates an imaging region.

Figure 2A:
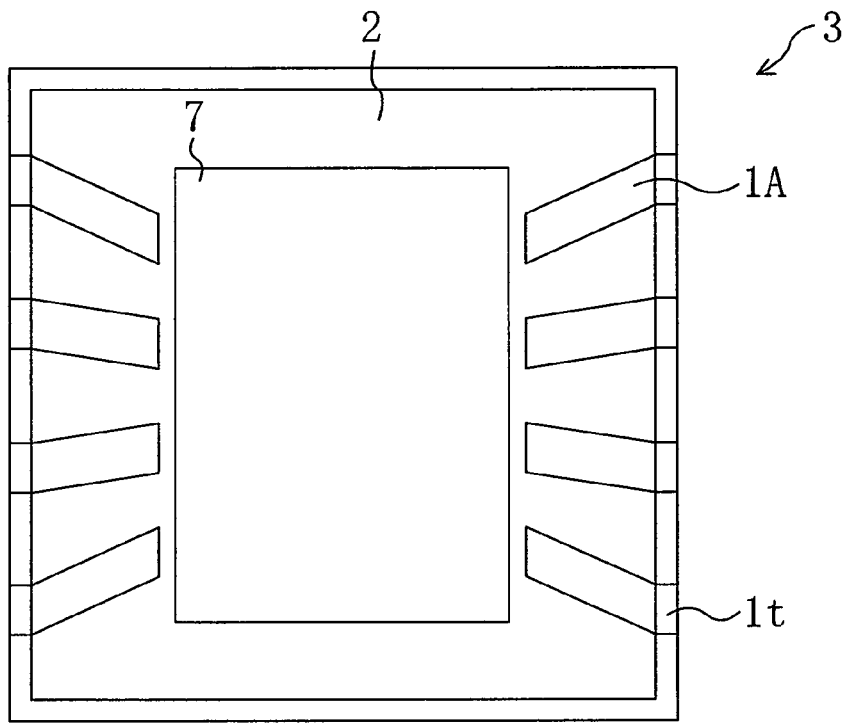
FIGS. 2A, 2B, and 2C are diagrams showing a structure of a base of the optical device.
Figure 2B:
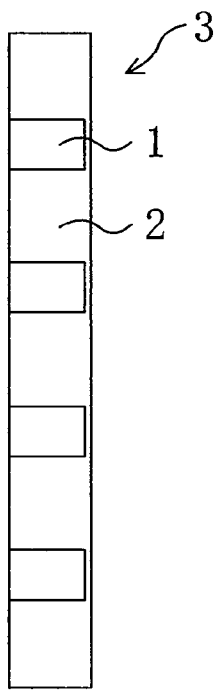
Figure 2C:
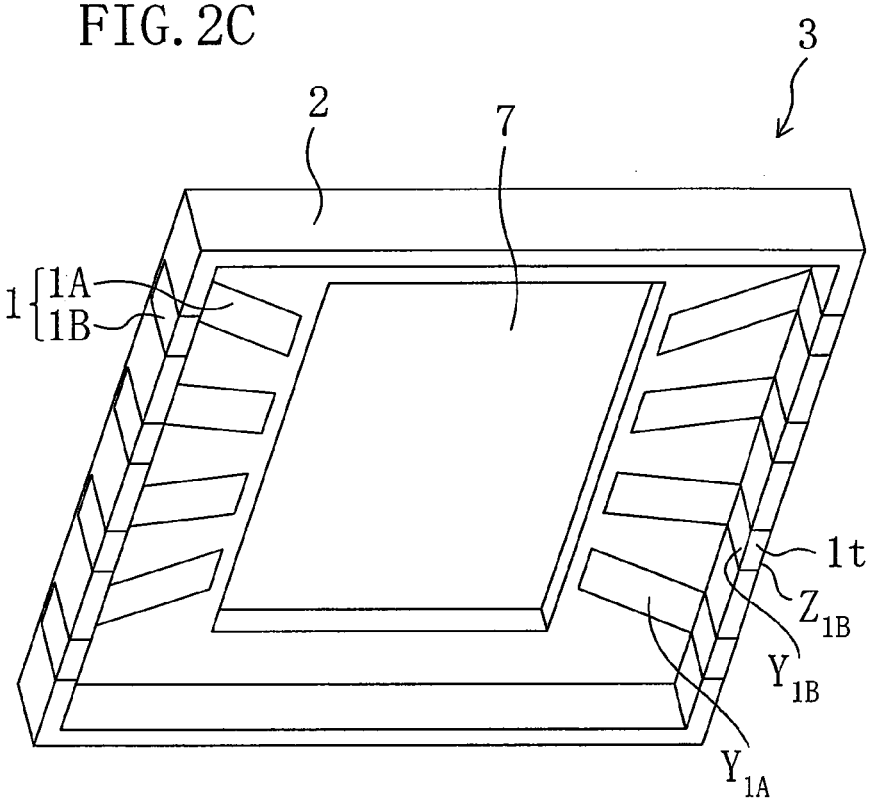

The structure of the base 3 of the optical device according to this embodiment will now be described with reference to FIGS. 2A through 2C. FIGS. 2A through 2C show the structure of the base of the optical device according to this embodiment. FIG. 2A is a plan view of the base 3 when viewed from the back side of the base 3, FIG. 2B is a side view of the base 3, and FIG. 2C is a perspective view of the base 3 when viewed from the back side of the base 3.

Regarding the inner leads 1A of the leads 1, the resin 2 is formed on respective inner ends (see $Z_{1A}$ in FIG. 1B) and front surfaces (see $X_{1A}$ in FIG. 1B) of the inner leads 1A and between adjacent inner leads 1A. The respective back surfaces (see $Y_{1A}$ in FIG. 2C) of the inner leads 1A are exposed.

Regarding the outer leads 1B of the leads 1, the resin 2 is formed between adjacent outer leads 1B. The respective front surfaces (see $X_{1B}$ in FIG. 1B), back surfaces (see $Y_{1B}$ in FIG. 2C), and outer ends (see $Z_{1B}$ in FIG. 2C) of the outer leads 1B are exposed.

As described above, the resin 2 is formed so as to cover the respective inner ends $Z_{1A}$ of the leads 1 and the respective front surfaces $X_{1A}$ of the inner leads 1A and to fill the gap between adjacent leads 1. The plurality of leads 1 are thus integrated by the resin 2. The respective outer ends $Z_{1B}$ of the leads 1, the respective front surfaces $X_{1B}$ of the outer leads 1B, and the respective back surfaces of the leads 1 (more specifically, the respective back surfaces $Y_{1A}$ of the inner leads 1A and the respective back surfaces $Y_{1B}$ of the outer leads 1B) are exposed.

The same material as that used in a normal lead frame, such as Cu (copper) alloy or 42-alloy (a super alloy containing 42% of Ni (nickel) in Fe (iron)), is used for the leads 1. The thickness of the leads 1 is, for example, in the range of 100 μm to 500 μM, and preferably about 250 μm. An insulating material, for example, a flexible resin such as an epoxy resin, is used as the resin 2.

For example, solder or gold is used as the bumps 6. Other materials such as an anisotropic conductor having high thermal conductivity efficiency can also be used as the bump 6.

In a conventional example, no resin is formed on outer leads and the whole surface of the outer leads is exposed. In this embodiment, on the other hand, the resin 2 is formed so as to fill the gap between adjacent outer leads 1B, and the outer end $Z_{1B}$, front surface $X_{1B}$, and back surface $Y_{1B}$ of each outer lead 1B are exposed. In this way, an optical device compatible with an existing surface-mounting type optical device having terminals only in a peripheral portion can be implemented. Therefore, the optical device of this embodiment can be replaced with, for example, an optical device that is used in an existing camera module.

An efficient heat release path is formed from the optical element 4 to the external terminals 1t through a metal having high thermal conductivity efficiency. Especially, since the bumps 6 are provided between the leads 1 and the electrode pads, the thermal conductivity efficiency can be improved as compared to a conventional example in which thin long gold wires are provided. Moreover, the respective front surfaces $X_{1A}$ of the inner leads 1 are covered with the resin 2 in this embodiment. Therefore, even when a camera module is formed by using the optical device of this embodiment, unnecessary reflection at the front surfaces $X_{1A}$ of the inner leads 1 can be prevented and only necessary light beams can reach the light detecting region 5.

Second Embodiment

Figure 3:
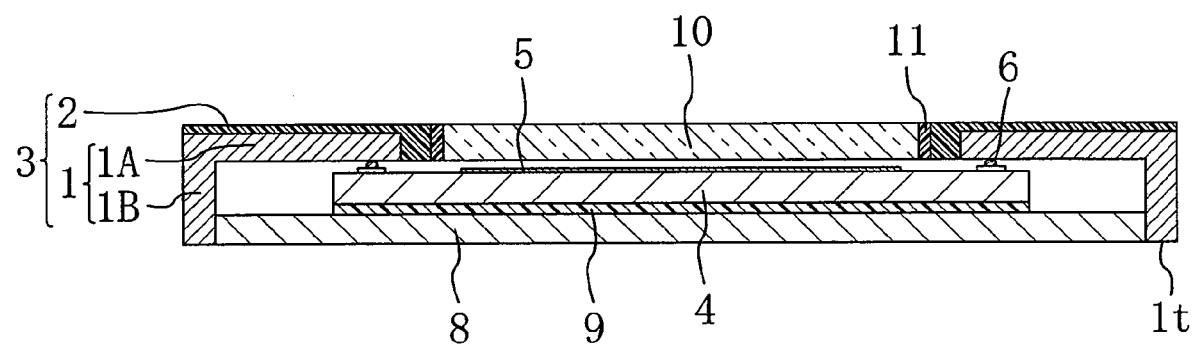
FIG. 3 is a cross-sectional view showing a structure of an optical device according to a second embodiment of the invention.

Hereinafter, an optical device according to a second embodiment of the invention will be described with reference to FIG. 3. FIG. 3 is a cross-sectional view showing a structure of the optical device of the second embodiment.

As shown in FIG. 3, the optical device of this embodiment further includes a thin plate body 8 and a transparent member 10 in addition to the structure of the first embodiment. The thin plate body 8 is provided under the optical element 4 through a bonding member 9, and the transparent member 10 is provided in the through hole of the base 3 through an adhesive 11.

The thin plate body 8 has a thickness of, for example, 200 μm to 400 μm. The thin plate body 8 is made of, for example, ceramic. The thin plate body 8 may alternatively be made of other materials such as a metal plate. For example, an adhesive is used as the bonding member 9. Other materials such as an adhesive sheet may alternatively be used as the bonding member 9.

The transparent member 10 is designed so that the front surface and back surface thereof extend in parallel with each other. The transparent member 10 forms an optical flat surface with such flatness that satisfies an optical application in which the transparent member 10 is used. The transparent member 10 has a thickness of, for example, 300 μm to 500 μm. The transparent member 10 may be made of, for example, optical glass, quartz, crystal, optical transparent resin, or the like.

In this embodiment, the same effects as those of the first embodiment can be obtained.

Moreover, since the thin plate body 8 is bonded to the back surface of the optical element 4 through the bonding member 9, a heat release path from the optical element 4 to the thin plate body 8 can be ensured, whereby the overall heat release efficiency of the optical element 4 can be improved.

Moreover, the base 3 is hermetically sealed by the transparent member 10 provided in the through hole 7 of the base 3 and the thin plate body 8 provided under the base 3 with the optical element 4 interposed therebetween. Therefore, dust, water and the like can be prevented from entering from the outside, and a defective optical device can be prevented from being caused by adhesion of dust, water, and the like.

[Manufacturing Method of the Base]

Hereinafter, a method for manufacturing the base 3 of this optical device will be described with reference to FIGS. 4A through 4E. FIGS. 4A through 4E are cross-sectional views sequentially illustrating main steps of the manufacturing method of the base of the optical device. Note that an example in which two bases 3 are manufactured will be described below.

Figure 4A:
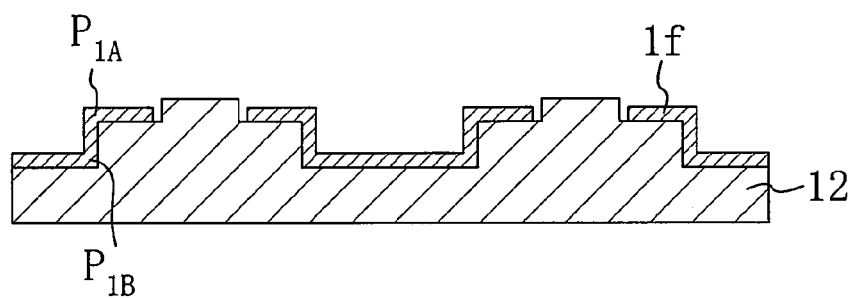
FIGS. 4A, 4B, 4C, 4D, and 4E are cross-sectional views sequentially illustrating main steps of a method for manufacturing a base of the optical device.

As shown in FIG. 4A, lead frames 1$f$ having a predetermined length are prepared. The number of lead frames 1$f$ corresponds to the number of leads included in an optical device. The length of the lead frames 1$f$ is determined according to the number of bases to be manufactured. For example, in the case where two bases are to be manufactured, the length of the lead frames 1$f$ is equal to the sum of lengths $I_1, I_2, I_3$ (see FIG. 4D) respectively corresponding to the regions to be punched out to obtain individual bases 3 and lengths $L_1, L_2$ (see FIG. 4E) required to form the bases. Openings are provided in the lead frames 1$f$ at positions corresponding to the respective positions of the through holes in the bases. The number of openings corresponds to the number of bases to be manufactured.

The lead frames 1$f$ are bent at positions $P_{1A}$ corresponding to the junctions between the inner leads and the outer leads of the leads and at positions $P_{1B}$ corresponding to the outer ends of the leads. The lead frames 1$f$ are then placed on a lower mold 12.

Figure 4B:
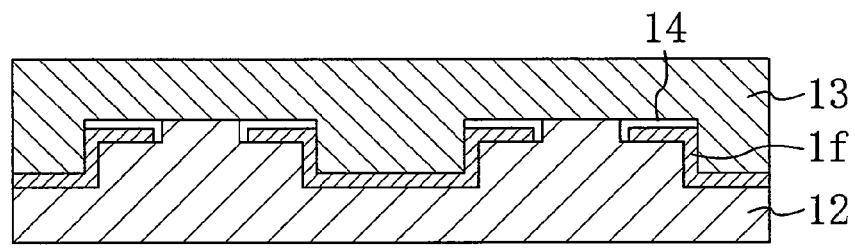

As shown in FIG. 4B, the lower mold 12 having the lead frames 1$f$ placed thereon and an upper mold 13 are then put together to form a cavity 14 between the upper mold 13 and the lower mold 12.

Figure 4C:
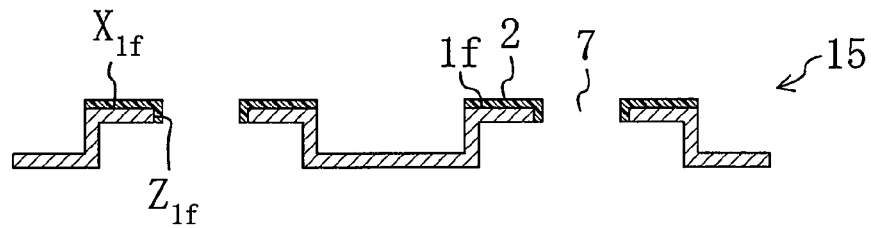

As shown in FIG. 4C, after the cavity 14 is filled with a resin 2 and the resin 2 is cured, the lower mold 12 and the upper mold 13 are opened to remove a molded body 15. The molded body 15 is formed by the lead frames 1$f$ corresponding to the number of leads included in an optical device and the resin 2 integrating the lead frames 1$f$. The molded body 15 has through holes 7 in the center of the regions corresponding to the bases, respectively. The resin 2 is thus formed so as to cover a surface $Z_{1f}$ to be the inner ends of the leads (see $Z_{1A}$ of FIG. 4E) and a surface $X_{1f}$ to be the front surfaces of the inner leads (see $X_{1A}$ of FIG. 4E) and to fill the gap between adjacent lead frames 1.

Figure 4D:
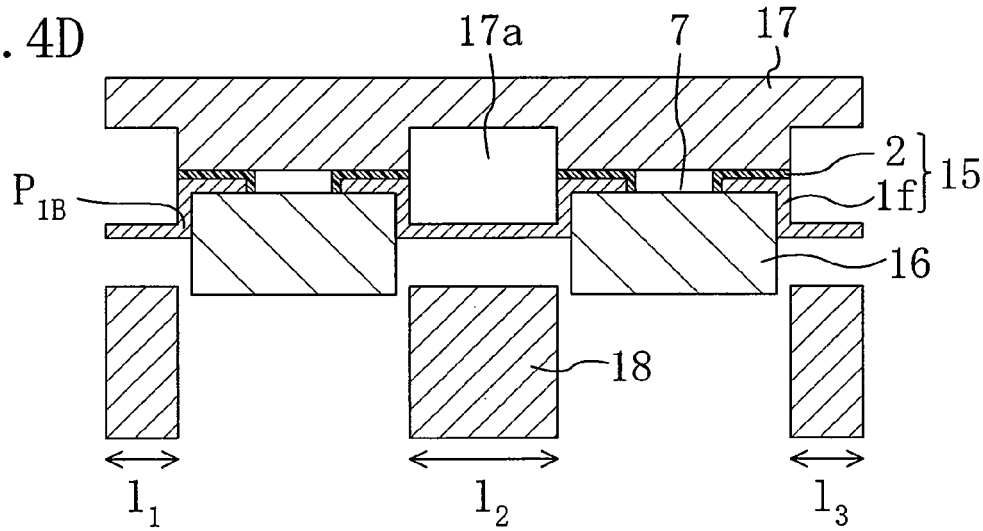

As shown in FIG. 4D, a stripper plate 16 and a die plate 17 are then placed so as to face each other with the molded body 15 interposed therebetween. The molded body 15 thus fixed between the stripper plate 16 and the die plate 17 is punched by a punching plate 18 in order to punch out the portions of the molded body 15 corresponding to the punching plate 18. The die plate 17 has a space 17$a$ for punching out the portions of the molded body 15 by the punching plate 18.

Figure 4E:
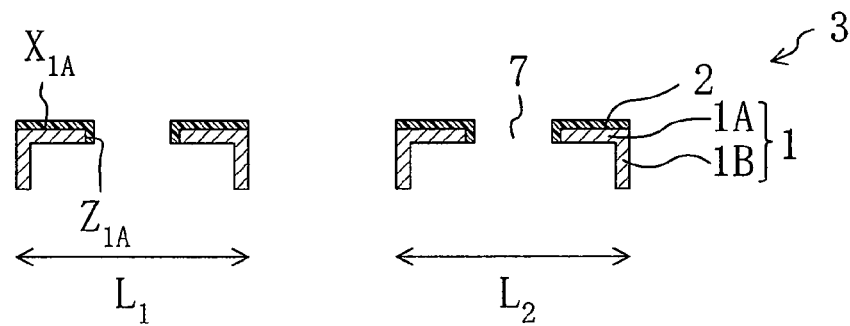

Finally, as shown in FIG. 4E, two individual bases 3 are obtained by opening the stripper plate 16 and the die plate 17. The individual bases 3 are thus obtained by cutting the molded body 15 at the positions $P_{1B}$ corresponding to the outer ends of the leads. Each base 3 is formed by a plurality of leads 1 included in an optical device and resin 2 integrating the plurality of leads 1, and has a through hole 7 in the center. Each lead 1 is formed by an inner lead 1A extending from the center toward a peripheral edge and an outer lead 1B connected to the inner lead 1A and extending downward, and has an L-shaped cross section. The resin 2 is formed so as to cover the inner ends $Z_{1A}$ of the leads 1 and the front surfaces $X_{1A}$ of the inner leads 1A and to fill the gap between adjacent leads 1.

The base of the optical device can thus be manufactured.

In this manufacturing method of the base of the optical device, the base can be manufactured by using only versatile lead processing technology and versatile resin molding technology. Therefore, the base can be easily manufactured at low cost.

Note that, although two bases are manufactured in the above-described example, the invention is not limited to this.

[Manufacturing Method of the Optical Device]

Hereinafter, a method for manufacturing an optical device according to the second embodiment of the invention will be described with reference to FIGS. 5A through 5E. FIGS. 5A through 5E are cross-sectional views sequentially illustrating main steps of the method for manufacturing an optical device according to the second embodiment.

Figure 5A:
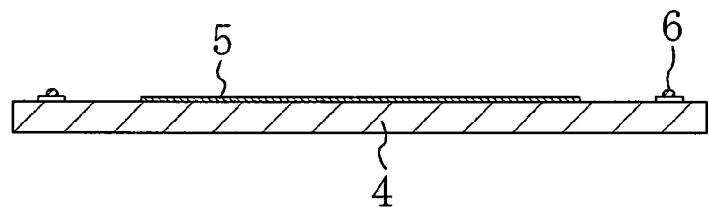
FIGS. 5A, 5B, 5C, 5D, and 5E are cross-sectional views sequentially illustrating main steps of a method for manufacturing an optical device according to a second embodiment of the invention.

As shown in FIG. 5A, an optical element 4 is prepared. The optical element 4 has a light detecting region 5 in the center of the surface and has bumps 6 formed on electrode pads.

Figure 5B:
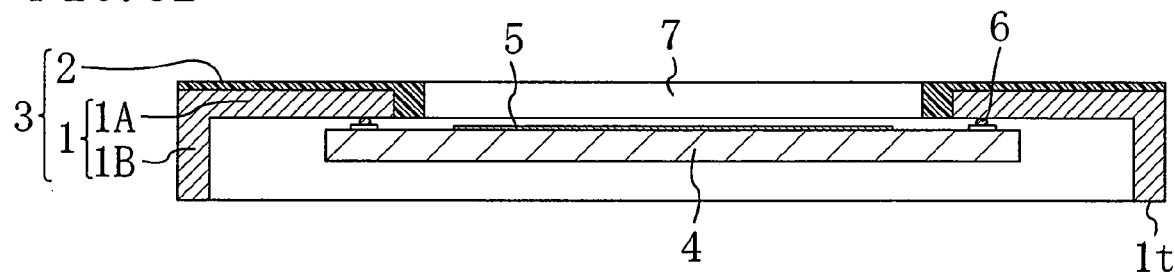

As shown in FIG. 5B, a base 3 manufactured by the above manufacturing method is then placed above the optical element 4 so that the through hole 7 of the base 3 corresponds to the optical element 4. The leads 1 of the base 3 are connected to the electrode pads of the optical element 4 through the bumps 6, respectively.

Figure 5C:
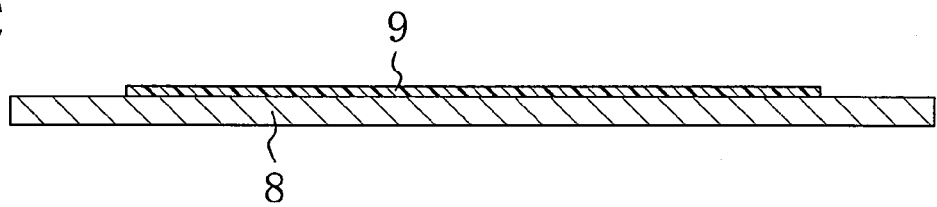

As shown in FIG. 5C, a thin plate body 8 is then prepared. The thin plate body 8 has a bonding member 9 formed thereon.

Figure 5D:
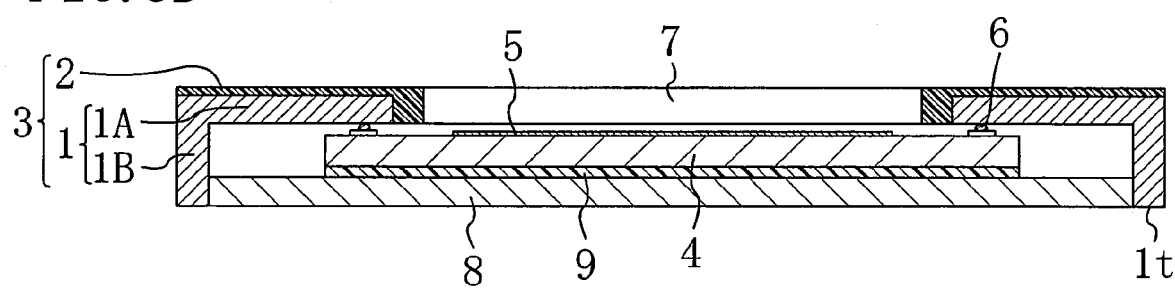

As shown in FIG. 5D, the thin plate body 8 is bonded to the back surface of the optical element 4 through the bonding member 9.

Figure 5E:
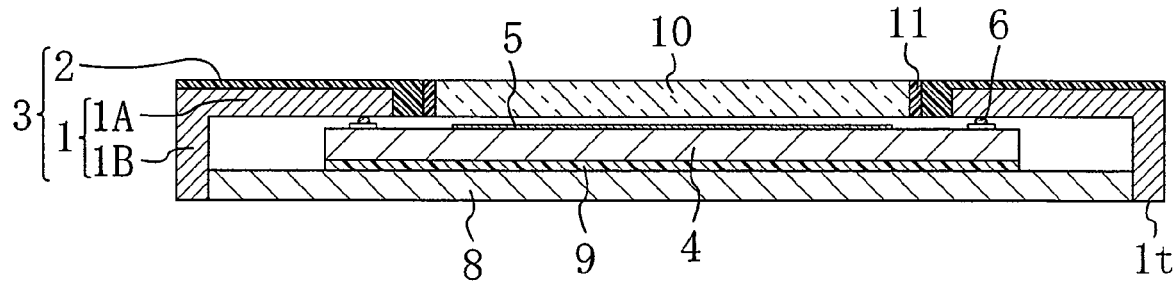

As shown in FIG. 5E, a transparent member 10 is then placed in the through hole 7 of the base 3 and bonded to the base 3 through an adhesive 11.

The optical device of this embodiment can thus be manufactured.

Figure 12:
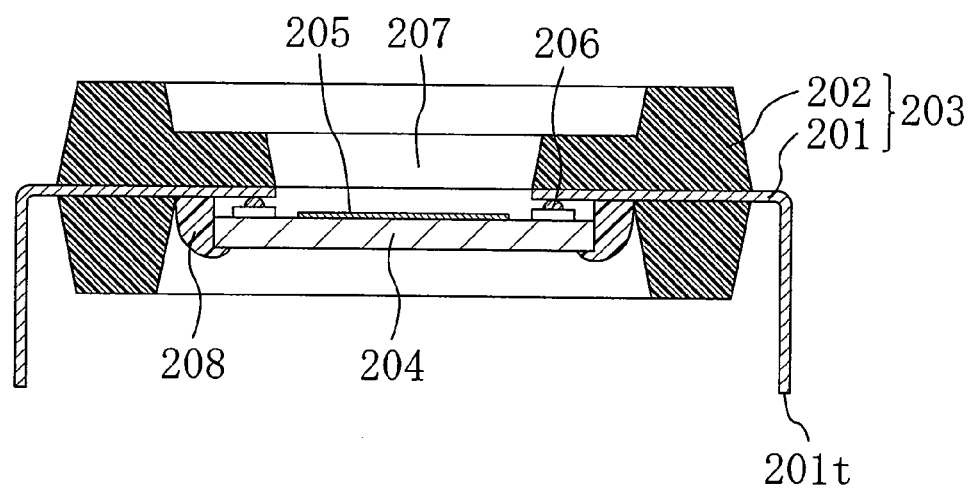
FIG. 12 is a cross-sectional view showing a structure of a conventional optical device.

In this embodiment, the optical device can be manufactured by using only versatile lead processing and resin molding technologies (see FIGS. 4A through 4E) and versatile bump bonding and adhesion technologies (see FIGS. 5A through 5E). Therefore, the optical device can be easily manufactured at low cost. In other words, the optical device can be manufactured without involving complicated formation such as formation of a light shielding film (see 208 in FIG. 12) as in a conventional example.

(Modification of the First Embodiment)

Figure 6:
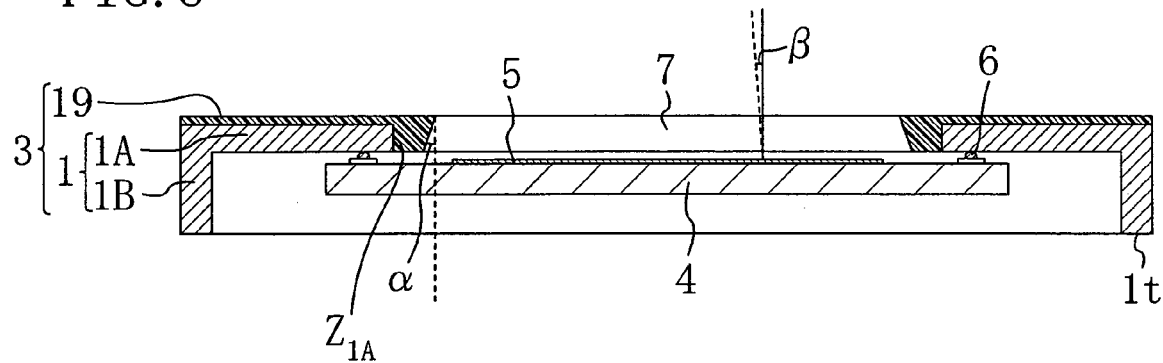
FIG. 6 is a cross-sectional view showing a structure of an optical device according to a modification of the first embodiment of the invention.

Hereinafter, an optical device according to a modification of the first embodiment of the invention will be described with reference to FIG. 6. FIG. 6 is a cross-sectional view showing a structure of the optical device according to the modification of the first embodiment.

This modification is structurally different from the first embodiment in the following point:

In the first embodiment, the through hole 7 defined by the resin formed on the inner ends $Z_{1A}$ of the leads 1 has a fixed inner diameter from the upper end to the lower end. In this modification, on the other hand, as shown in FIG. 6, the through hole 7 has a tapered shape so that the inner diameter of the through hole 7 significantly increases from the upper end to the lower end. As shown in FIG. 6, a resin 19 is formed so that a taper angle α becomes larger than an expected incidence angle β of incident light.

In this modification, incident light entering the through hole 7 of the base 3 is not reflected from the inner surface of the through hole 7. Therefore, noise light can be prevented from being generated from the incident light reflected from the inner surface of the through hole 7 to the light detecting region 5 of the optical element 4.

(First Modification of the Second Embodiment)

Figure 7:
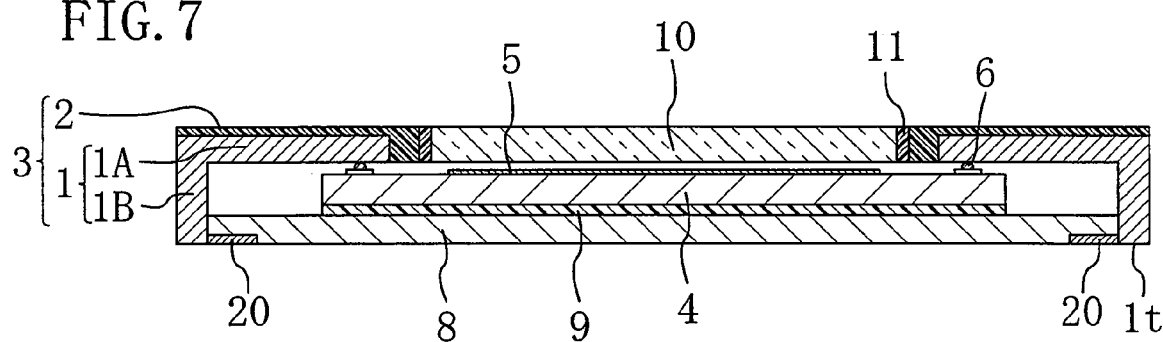
FIG. 7 is a cross-sectional view showing a structure of an optical device according to a first modification of the second embodiment of the invention.

Hereinafter, an optical device according to a first modification of the second embodiment of the invention will be described with reference to FIG. 7. FIG. 7 is a cross-sectional view showing a structure of the optical device according to the first modification of the second embodiment.

This modification is structurally different from the second embodiment in the following point:

As shown in FIG. 7, the optical device of this modification further includes electrodes 20 in addition to the structure of the optical device of the second embodiment. The electrodes 20 are provided at the back surface of the thin plate body 8 so as to correspond to the external terminals it, respectively.

In this modification, not only electric connection with the external terminals it but electric connection with the electrodes 20 can be ensured when the optical device is introduced into a camera module. Therefore, the optical device can be reliably introduced into the camera module (see a third embodiment below).

(Second Modification of the Second Embodiment)

Figure 8:
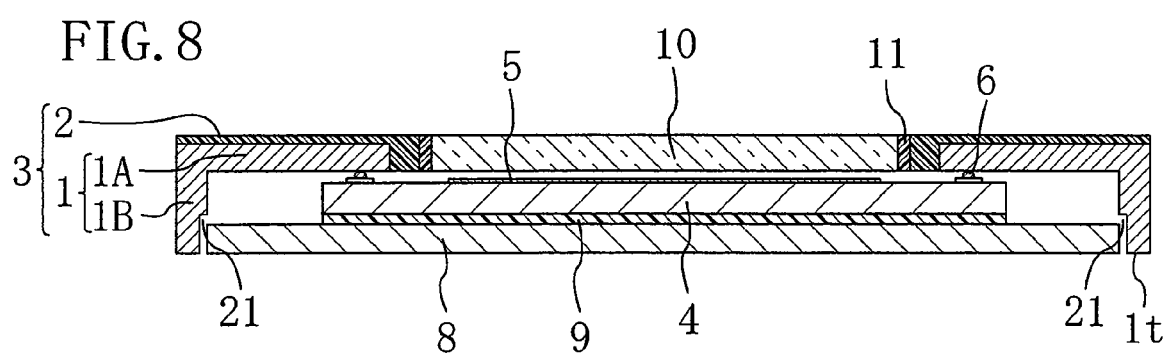
FIG. 8 is a cross-sectional view showing a structure of an optical device according to a second modification of the second embodiment of the invention.

Hereinafter, an optical device according to a second modification of the second embodiment of the invention will be described with reference to FIG. 8. FIG. 8 is a cross-sectional view showing a structure of the optical device according to the second modification of the second embodiment.

This modification is structurally different from the second embodiment in the following point:

As shown in FIG. 8, in the optical device of this modification, a stepped portion 21 having a shape corresponding to the corner shape of the thin plate body 8 is provided in an outer end region of the base 3. The thin plate body 8 is mounted in the stepped portion 21 so that the base 3 and the thin plate body 8 fit together.

In this modification, the thin plate body 8 can be easily positioned when the thin plate body 8 is attached to the optical element 4. As a result, attachment accuracy can be improved and an attachment method can be simplified as compared to the second embodiment.

Third Embodiment

Figure 9:
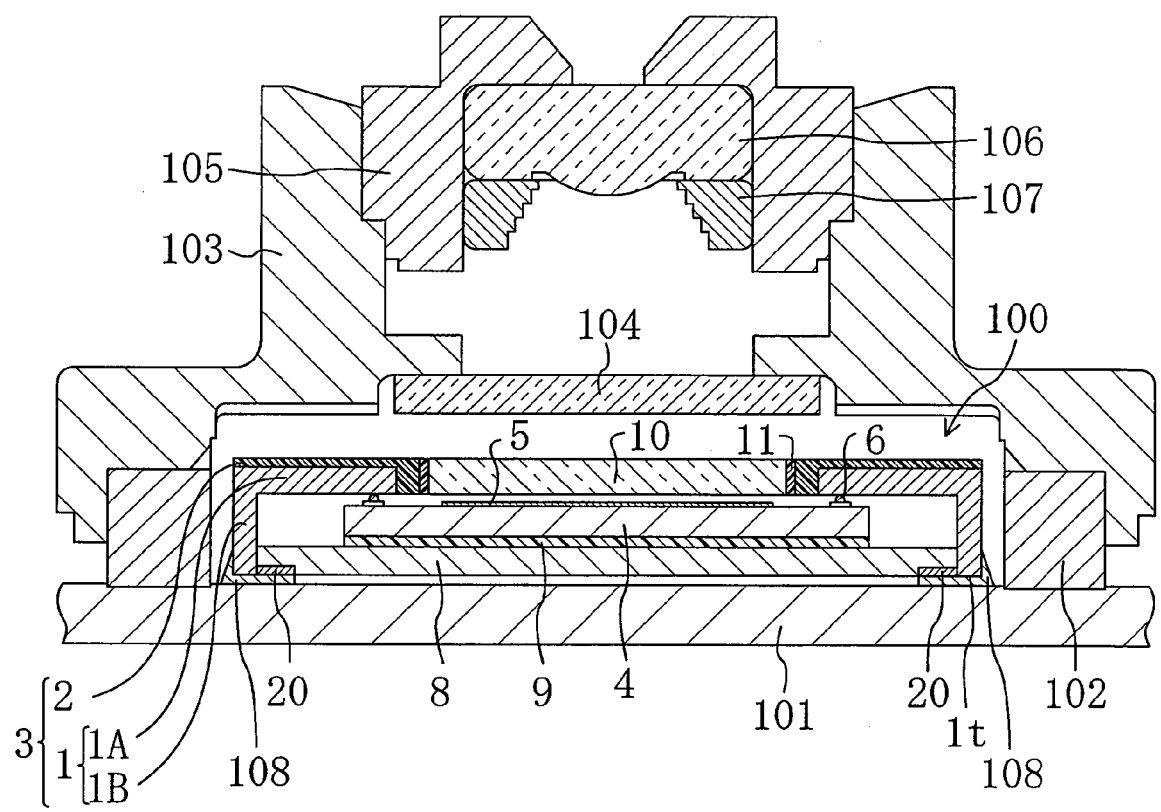
FIG. 9 is a cross-sectional view showing a structure of a camera module according to a third embodiment of the invention.

Hereinafter, a camera module according to a third embodiment of the invention (a camera module including the optical device of the invention) will be described. A camera module including the optical device of the first modification of the second embodiment will be described below as an example. FIG. 9 is a cross-sectional view showing a structure of the camera module of the third embodiment.

The "camera module" herein indicates various types of equipments such as a digital still camera, a mobile phone camera, a video camera with mobile phone, an on-board camera, a surveillance camera, a video camera, a medical camera, a broadcast camera, a webcam, a camera with video phone, a game camera, an optical mouse, a DVD (Digital Versatile Disc) drive, and a CD (Compact Disc) drive. Note that when the optical device of the invention is used in the camera module, the optical element of the optical device is a light receiving element such as an image sensor.

As shown in FIG. 9, the camera module of this embodiment includes an optical device 100, a wiring board 101, a positioning spacer 102, a cylindrical lens-barrel base 103, a glass plate 104, a lens accommodating portion 105, a lens 106, and a lens holder 107. The optical device 100 is mounted on the wiring board 101. The positioning spacer 102 is provided around the optical device 100. The cylindrical lens-barrel base 103 is fixed above the wiring board 101 with the spacer 102 interposed therebetween, and has a hollow above the light detecting region (more specifically, light receiving region) 5 of the optical element 4. The glass plate 104 is provided above the light receiving region 5 and fixed to the bottom of the lens-barrel base 103. The lens accommodating portion 105 is provided in the hollow of the lens-barrel base 103. The lens holder 107 is fixed in the lens accommodating portion 105. The lens 106 is provided above the light receiving region 5 and supported by the lens holder 107.

The external terminals it of the optical device are connected to wirings (not shown) provided on the wiring board 101 through solder 108 formed on the wiring board 101.

According to this embodiment, the overall heat release efficiency of the optical element can be improved while maintaining excellent heat release efficiency of a control circuit (not shown) on the optical element 4. Therefore, the heat release efficiency of the camera module including the optical device can be improved.

Moreover, instead of an optical device of an existing camera module, the optical device 100 can be introduced into the existing camera module. In other words, the optical device 100 can be applied to an existing camera module without any change in design.

Moreover, when the optical device 100 is mounted on the wiring board 101 and introduced into an existing camera module, not only the bonding area with the external terminals 1t but the bonding area with the electrodes 20 can be ensured as the bonding area of the solder 108. Therefore, the optical device can be reliably introduced into an existing camera module.

Moreover, the optical device can be easily manufactured at low cost (see the second embodiment above). Therefore, a camera module including the optical device can be easily provided at low cost.

Fourth Embodiment

Figure 10A:
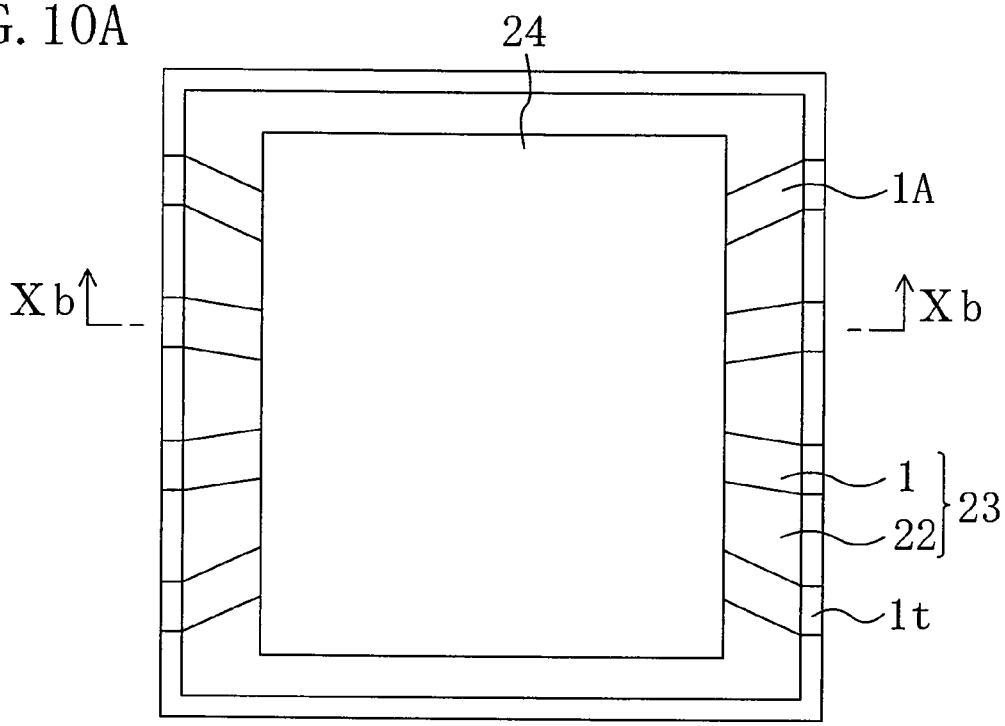
FIGS. 10A, 10B, and 10C are diagrams showing a structure of a semiconductor device according to a fourth embodiment of the invention.
Figure 10B:
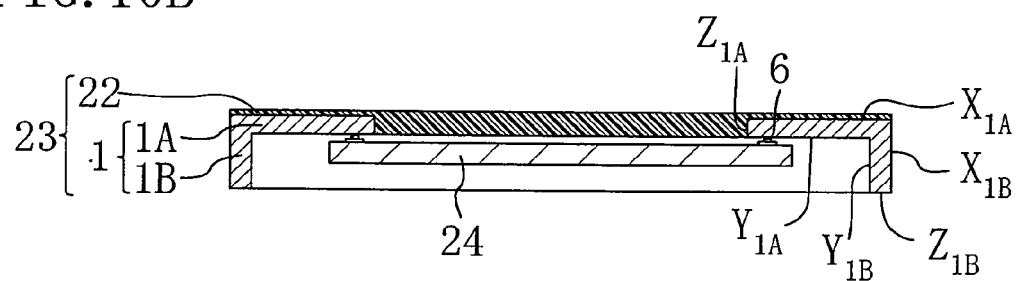
Figure 10C:
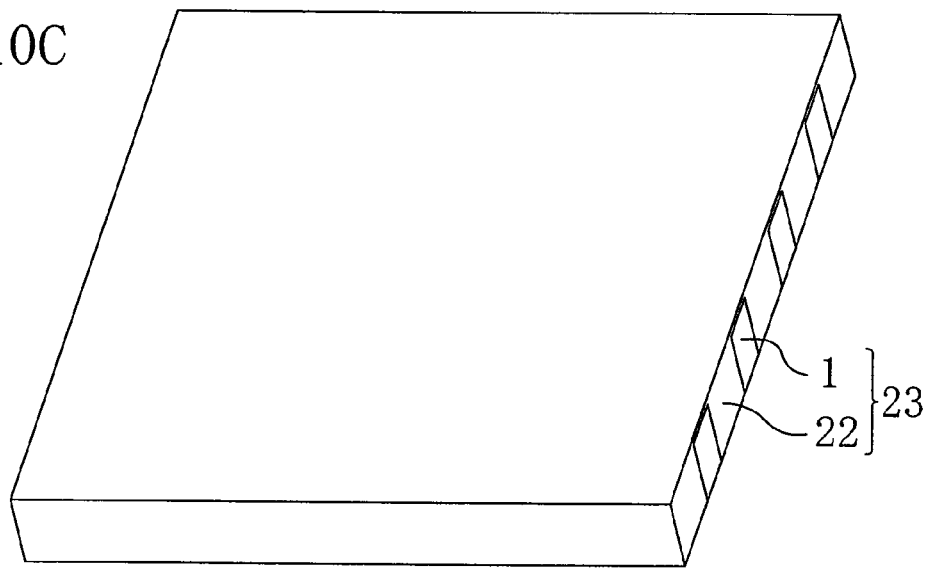

Hereinafter, a semiconductor device according to a fourth embodiment of the invention will be described with reference to FIGS. 10A through 10C. FIGS. 10A through 10C are diagrams showing a structure of the semiconductor device of the fourth embodiment. FIG. 10A is a plan view of the semiconductor device when viewed from the back side of a semiconductor element. FIG. 10B is a cross-sectional view taken along line Xb-Xb in FIG. 10A. FIG. 10C is a perspective view of the semiconductor device when viewed from the front side of the semiconductor element. Note that, in this embodiment, the same elements as those of the first embodiment are denoted by the same reference numerals and characters as those of FIGS. 1A through 1C.

As shown in FIG. 10B, the semiconductor device of this embodiment mainly includes a base 23 and a semiconductor element 24. The base 23 includes leads 1 and a resin 22. The semiconductor element 24 has electrode pads provided under the base 23 so as to correspond to the leads 1, respectively. The leads 1 of the base 23 are connected to the electrode pads of the semiconductor element 24 through bumps 6, respectively.

Regarding the inner leads 1A of the leads 1, as shown in FIG. 10B, the resin 22 is formed on the respective inner ends $Z_{1A}$ and front surfaces $X_{1A}$ of the inner leads 1A and between adjacent inner leads 1A. The respective back surfaces $Y_{1A}$ of the inner leads 1A are exposed. Regarding the outer leads 1B of the leads 1, on the other hand, as shown in FIG. 10B, the resin 22 is formed between adjacent outer leads 1B. The respective front surfaces $X_{1B}$, back surfaces $Y_{1B}$, and outer ends $Z_{1B}$ of the outer leads 1B are exposed.

As described above, the resin 22 is formed so as to cover the respective inner ends $Z_{1A}$ of the leads 1 and the respective front surfaces $X_{1A}$ of the inner leads 1A and to fill the gap between adjacent leads 1. The plurality of leads 1 are thus integrated by the resin 22. The respective outer ends $Z_{1B}$ of the leads 1, the respective front surfaces $X_{1B}$ of the outer leads 1B, and the respective back surfaces of the leads 1 (more specifically, the respective back surfaces $Y_{1A}$ of the inner leads 1A and the respective back surfaces $Y_{1B}$ of the outer leads 1B) are exposed.

This embodiment is structurally different from the first embodiment in the following points:

In this embodiment, the optical element of the first embodiment (see 4 in FIGS. 1A through 1C) is replaced with the semiconductor element 24 as shown in FIGS. 10A and 10B. Moreover, the base of the first embodiment (see 3 in FIGS. 1B and 1C) has a through hole (see 7 in FIGS. 1B and 1C) in the center, while the base 23 of this embodiment has no through hole.

In this embodiment, an efficient heat release path is formed from the semiconductor element 24 to the external terminals It through a metal having high thermal conductivity efficiency. Especially, since the bumps 6 are provided between the leads 1 and the electrode pads, the thermal conductivity efficiency can be improved as compared to a conventional example in which thin long gold wires are provided.

Fifth Embodiment

Figure 11:
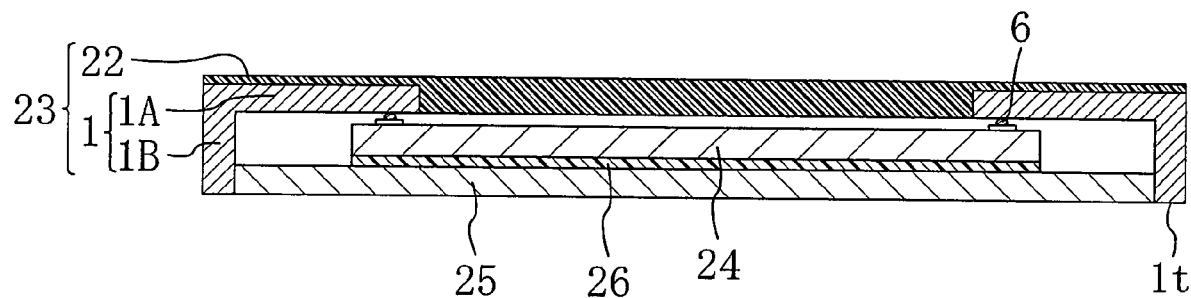
FIG. 11 is a cross-sectional view showing a structure of a semiconductor device according to a fifth embodiment of the invention.

Hereinafter, a semiconductor device according to a fifth embodiment of the invention will be described with reference to FIG. 11. FIG. 11 is a cross-sectional view showing a structure of the semiconductor device of the fifth embodiment. In this embodiment, the same elements as those of the fourth embodiment will be denoted by the same reference numerals and characters as those of FIG. 10B.

As shown in FIG. 11, the semiconductor device of this embodiment further includes a thin plate body 25 addition to the structure of the fourth embodiment. The thin plate body 25 is provided under the semiconductor element 24 through a bonding member 26.

Note that the thin plate body 25 of this embodiment may have the same structure as that of the thin plate body 8 of the second embodiment. The bonding member 26 of this embodiment may have the same structure as that of the bonding member 9 of the second embodiment.

In this embodiment, the same effects as those of the fourth embodiment can be obtained.

Moreover, since the thin plate body 25 is bonded to the back surface of the semiconductor element 24 through the bonding member 26, a heat release path from the semiconductor element 24 to the thin plate body 25 can be ensured, whereby the overall heat release efficiency of the semiconductor element 24 can be improved.

Moreover, the base 23 is hermetically sealed by the thin plate body 25 provided under the base 23 with the semiconductor element 24 interposed therebetween. Therefore, dust, water and the like can be prevented from entering from the outside, and a defective semiconductor device can be prevented from being caused by adhesion of dust, water, and the like.

As has been described above, in the optical device of the invention, the overall heat release efficiency of the optical element can be improved while maintaining excellent heat release efficiency of a control circuit on the optical element. Therefore, the optical device of the invention is useful for, for example, a digital still camera, a mobile phone camera, a surveillance camera, and a video camera. Moreover, in the semiconductor device of the invention, the overall heat release efficiency of the semiconductor element can be improved. Therefore, the semiconductor device of the invention is useful for, for example, a discrete device (such as a power MOSFET (Metal-Oxide-Semiconductor Field-Effect-Transistor) and a SAW (Surface Acoustic Wave) device).

What is claimed is:

1. An optical device, comprising:
   a base having a main surface and a side surface which surrounds the main surface, having a through hole formed in a center of the main surface and including leads and a resin, the leads having L-shaped cross-sections and being formed by inner leads extending from the center toward a peripheral edge and outer leads connected to the inner leads and extending downward;
   and an optical element provided under the base so as to correspond to the through hole, wherein
   electrode pads of the optical element are connected to the leads of the base via bumps,
   the resin is formed so as to cover inner ends of the inner leads and front surfaces of the inner leads and to fill a gap between the adjacent outer leads to form the side surface of the base,
   front surfaces of the outer leads are exposed to the side surface of the base,
   outer ends of the outer leads and the front surfaces of the outer leads are exposed from the resin,
   a thickness of each the exposed front surfaces of the outer leads is greater than a thickness of the optical element in a vertical direction, and
   an outer side surface of the resin and the exposed front surfaces of the outer leads are flush with one another so as to form a plane.

2. The optical device according to claim 1, further comprising a thin plate body provided under a back surface of the optical element.

3. The optical device according to claim 2, wherein the thin plate body is made of a material having high thermal conductivity efficiency.

4. The optical device according to claim 2, wherein a bonding member is provided between the optical element and the thin plate body.

5. The optical device according to claim 2, further comprising a transparent member provided in the through hole of the base, wherein the optical element provided under the base is hermetically sealed by the transparent member and the thin plate body.

6. The optical device according to claim 5, wherein an adhesive is provided between the transparent member and the base.

7. The optical device according to claim 2, further comprising electrodes provided on a back surface of the thin plate body so as to correspond to external terminals located at the outer ends of the outer leads, respectively.

8. The optical device according to claim 2, wherein a stepped portion having a shape corresponding to a corner shape of the thin plate body is provided in an outer end region of the base, and the thin plate body is mounted in the stepped portion so that the base and the thin plate body fit together.

9. The optical device according to claim 1, wherein a part of the resin which is formed on the inner ends of the inner leads has a tapered shape so that an inner diameter of the through hole increases from an upper end toward a lower end.

10. The optical device according to claim 1, wherein the entirety of each of the leads exhibits the L-shaped cross section.

11. The optical device according to claim 1, wherein the exposed front surface of each of the outer leads extends downwardly from the respective inner lead.

12. The optical device according to claim 1, wherein an inner most surface of each of the inner leads is covered by the resin.

* * * * *